United States Patent
Scholz et al.

[11] Patent Number: 6,116,921
[45] Date of Patent: Sep. 12, 2000

[54] ELECTRICAL CONNECTOR HAVING RECESSED SOLDERBALL FOOT

[75] Inventors: James P. Scholz; James J. Cain, both of Mechanicsburg; Peter P. Wilson, Palmyra, all of Pa.

[73] Assignee: The Whitaker Corporation, Wilmington, Del.

[21] Appl. No.: 09/024,048

[22] Filed: Feb. 16, 1998

[51] Int. Cl.[7] .................................................. H01R 9/09
[52] U.S. Cl. ........................................................ 439/83
[58] Field of Search .............................. 439/83, 876, 441, 439/862

[56] References Cited

U.S. PATENT DOCUMENTS

| | | | |
|---|---|---|---|
| 4,679,889 | 7/1987 | Seidler | 439/83 |
| 4,767,344 | 8/1988 | Noschese | 439/83 |
| 5,199,884 | 4/1993 | Kaufman et al. | 439/74 |
| 5,504,277 | 4/1996 | Danner | 439/83 |
| 5,593,322 | 1/1997 | Swamy et al. | 439/83 |
| 5,636,104 | 6/1997 | Oh | 439/777 |
| 5,741,144 | 4/1998 | Elco et al. | 439/101 |

OTHER PUBLICATIONS

Abstract and drawings from patent application serial No. 08/949,010.

*Primary Examiner*—Steven L. Stephan
*Assistant Examiner*—J. F. Duverne

[57] ABSTRACT

An electrical connector includes a dielectric housing (10) having a mating face (12) and a pocket (32) in the mating face (12). The housing carries an electrical contact (20) having a mounting surface (54) which is disposed within the pocket (32). Walls (33, 34, 35, 36) of the pocket (32) are configured to closely encompass at least a portion of a solderball (60) which is attached to the mounting surface (54). The pocket (32) facilitates attachment of a solderball (60) to the sheared edge of a narrow edge-stamped contact, and reduces the overall height of the connector.

18 Claims, 3 Drawing Sheets

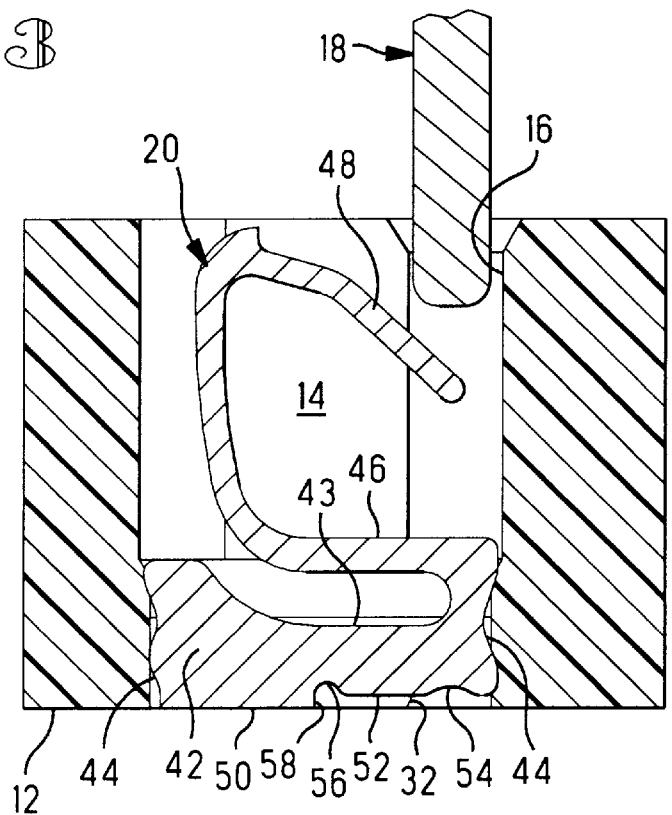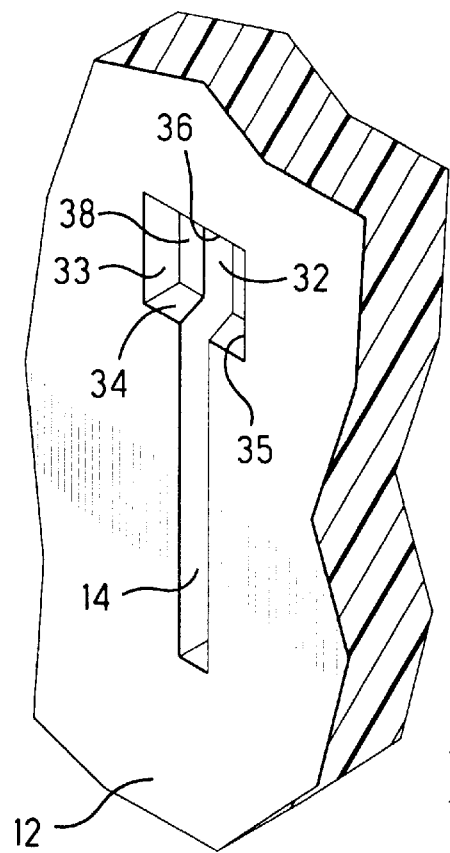

ELECTRICAL CONNECTOR HAVING RECESSED SOLDERBALL FOOT

FIELD OF THE INVENTION

The invention relates to an electrical connector having a contact with a solderball foot which provides an electrical interface between the contact and a mating component.

BACKGROUND OF THE INVENTION

U.S. patent application Ser. No. 08/949,010, which has the same assignee as the present application, discloses an electrical connector having contacts with solderball leads which are arranged in a ball grid array interface for connection with conductive pads on a circuit board. Each of the contacts is stamped and formed from sheet material and has an undersurface which is defined by a major surface of the sheet material. The undersurface of each contact is exposed at a bottom of the housing, and a solder ball is attached to the flat undersurface of each contact. It is a difficult manufacturing procedure to form the contacts in a very low height, i.e., less than 0.125 inch, and to attach a solderball in an accurate position on the flat undersurface of each contact. A problem to be solved is how to simplify the manufacture of an electrical connector having low profile contacts with solderball leads.

SUMMARY OF THE INVENTION

This problem is solved by an electrical connector according to the invention. The connector comprises a dielectric housing having a mating face and a pocket in the mating face. The housing carries an electrical contact having a mounting sarface which is disposed within the pocket. Walls of the pocket are configured to closely encompass at least a portion of a solderball which is attached to the mounting surface.

According to one aspect, the contact is stamped from sheet material having opposite major surfaces, and the mounting surface is formed along an edge of the contact which extends through a thickness of the sheet material between the opposite major surfaces.

According to another aspect, the mounting surface has a concave arcuate profile.

According to a further aspect, the contact includes a base portion having a recessed edge that is disposed within the housing below the mating face, the mounting surface is formed along the recessed edge, and the base portion has a riser that extends from the recessed edge toward the mating face, thereby providing a solder dam.

BRIEF DESCRIPTION OF THE DRAWINGS

The invention will now be described by way of example with reference to the accompanying drawings wherein:

FIG. 3 is enlarged cross-sectional view through the connector showing the contact mounted in the housing;

FIG. 4 is an enlarged fragmentary isometric view of a mating face of the housing;

DETAILED DESCRIPTION OF A PREFERRED EMBODIMENT

Figure 1:
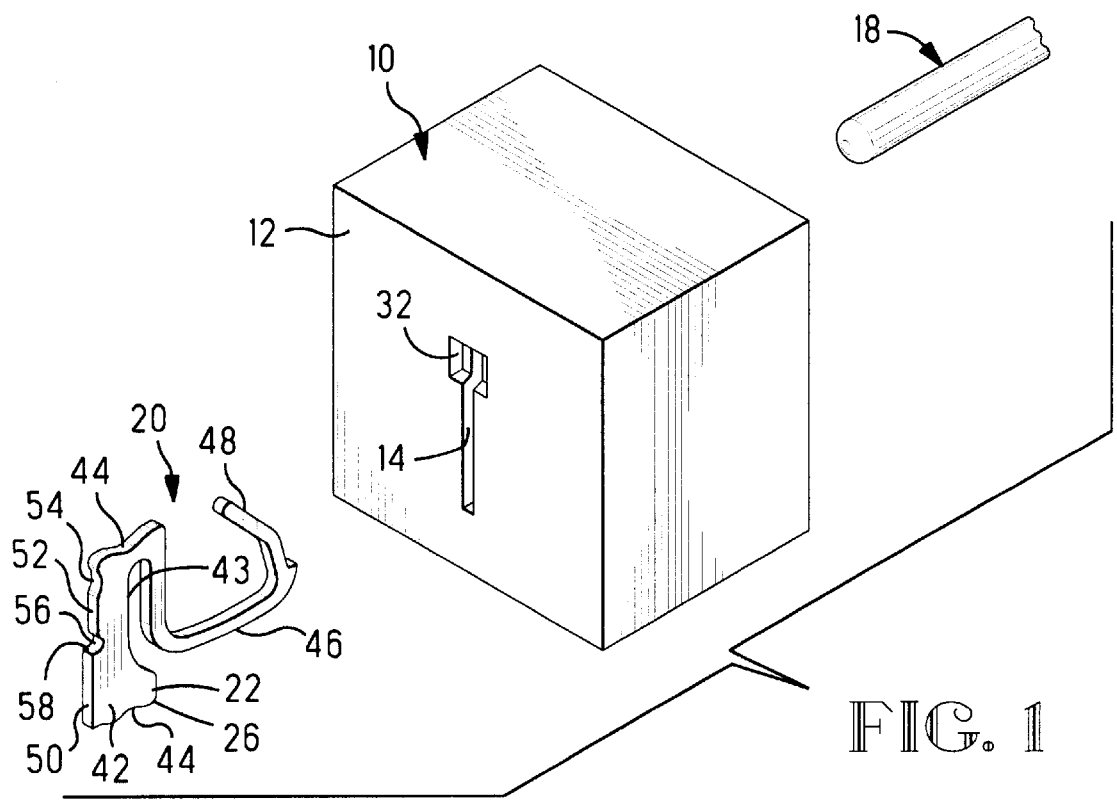
FIG. 1 is an exploded isometric view of a representative housing and a contact for use in an electrical connector according to the invention, along with a mating pin which is received in the connector.
Figure 2:
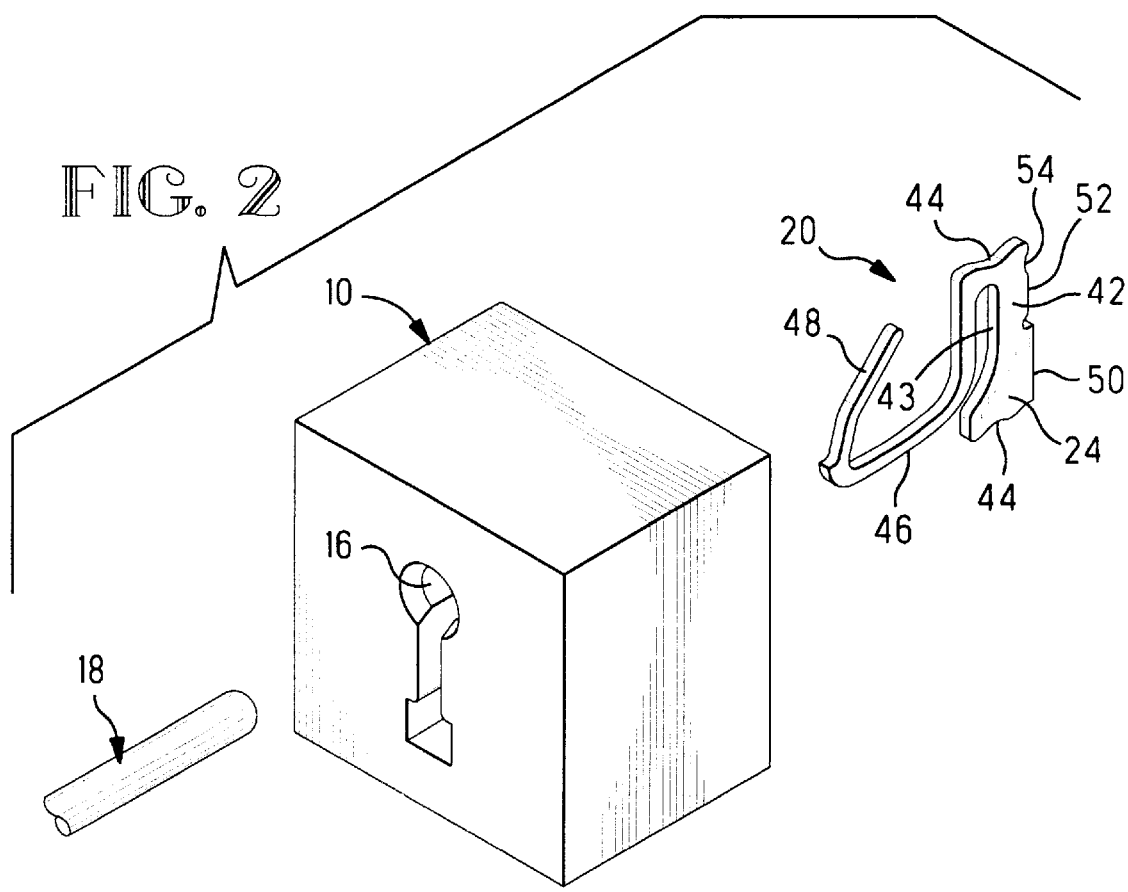
FIG. 2 is an exploded isometric view of the connector and mating pin from a different direction.

There is shown in FIGS. 1 and 2 a representative dielectric housing 10 and a conductive contact 20 for use in an electrical connector according to the invention. Although the invention will be discussed with regard to the representative housing 10 and the one contact 20, it should be understood that the invention will normally be embodied in a connector housing which carries a plurality of contacts in an orderly array.

The housing 10 has a mating face 12 which is adapted to confront a circuit board (not shown), a contact-receiving slot 14 which opens into the housing through the mating face, and a pin-receiving cavity 16 which opens through an opposite face of the housing to permit insertion of a lead 18 of an electronic component, such as a pin of a pin grid array electronic package, into the connector. The housing 10 also has a pocket 32 which encompasses a portion of the slot 14 in the mating face 12. The pocket 32 intersects the slot and is wider than the slot. The pocket will be discussed in more detail hereinbelow.

The contact 20 includes an electrically conductive body which is manufactured from sheet material such as by shearing or flat stamping the sheet material to a desired contact profile. The contact 20 has opposite side surfaces 22, 24 which correspond to opposite major surfaces of the sheet material, and the contact has a peripheral edge 26 which circumscribes the contact and corresponds to a thickness through the sheet material. The contact has a width which is equal to the thickness of the sheet material, and the width of the contact is only slightly less than the width of the slot 14 in the housing.

With reference also to FIG. 3, the contact 20 has a base portion 42 which is dimensioned for an interference fit in the slot 14 due to engagement of undulating edges 44 of the base portion with end walls of the slot. Extending from the base portion 42 is a contact arm 46 having a resilient end portion 48 that extends into the cavity 16 for engagement with the lead 18 that is received therein.

The base portion 42 of the contact has a lower edge 50 which resides substantially coplanar with the mating face 12 of the housing when the contact is installed in the housing. The base portion 42 also has a recessed edge 52 which resides in the housing at a depth from the mating face 12. A portion of the recessed edge 52 resides in the pocket 32. This portion provides a mounting surface 54 that is adapted to have a solderball attached thereto so as to provide a solderball foot for the contact 20. As shown, the mounting surface 54 preferably has a concave arcuate profile which serves as a nest for the solderball. Due to the mounting surface 54 being recessed at a depth in the pocket 32, the solderball is partially recessed in the housing, thereby lowering the overall height of the connector.

Figure 5:
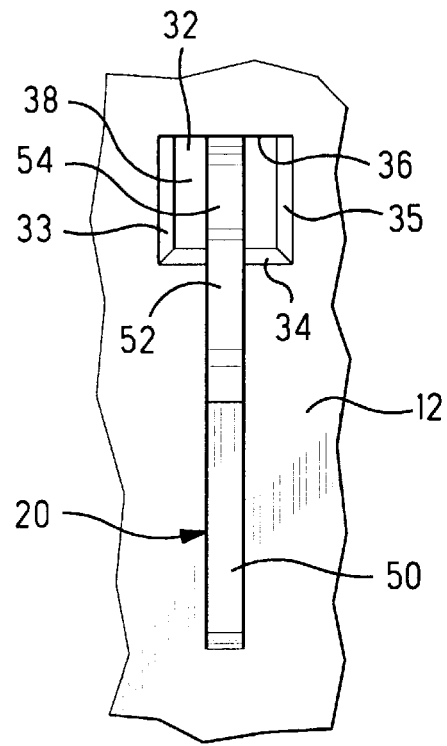
FIG. 5 is an enlarged fragmentary plan view of the mating face showing the contact mounted in the housing.

As shown in detail in FIGS. 4 and 5, the pocket 32 is bounded by four side walls 33, 34, 35, 36 and a bottom wall 38 which together define a trapezoidal shape. Three of the side walls 33, 34, 35 are angled so as to converge as they extend from the mating face 12 of the housing to the bottom wall 38. The side wall 36 extends perpendicular to the mating face 12. The bottom wall 38 is disposed at a depth from the mating face, and. this depth is selected to be at least as great as the depth of the mounting surface 54 from the mating face. In this way, the mounting surface is always exposed within the pocket 32 to permit attachment of the solderball to the mounting surface.

The side walls 33, 34, 35, 36 are configured to guide, align and control the position of the solderball as it is being applied to the mounting surface 54. The side walls closely encompass a portion of the solderball when the solderball is positioned on the mounting surface. The mounting surface is coated with a flux prior to attachment of the solderball. The side walls serve to support the solderball prior to attachment and to ensure that the solderball is correctly positioned on the relatively narrow mounting surface during solder reflow.

Figure 6:
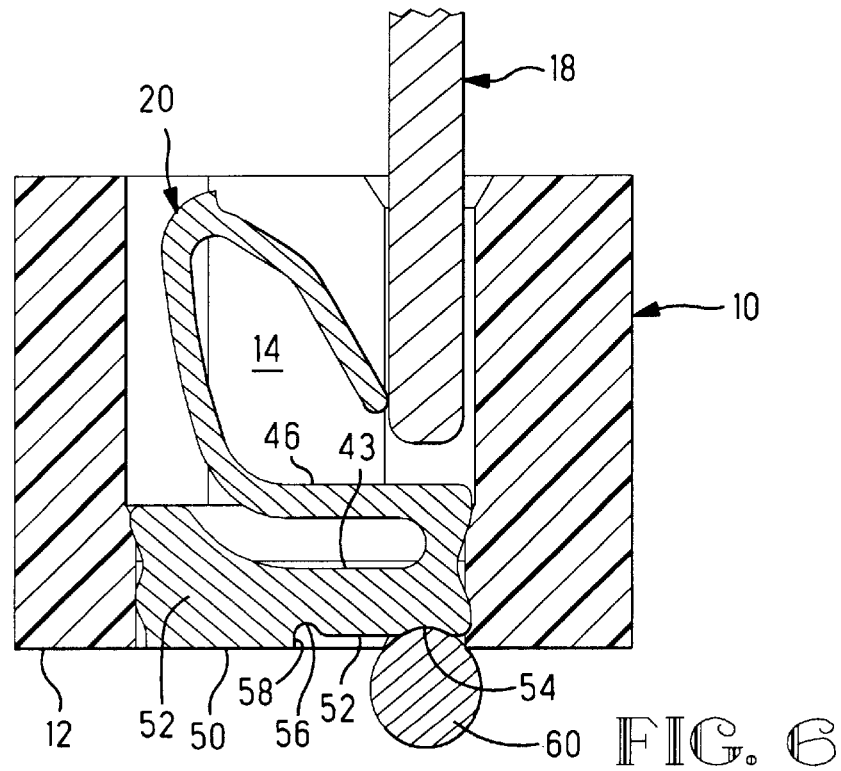
FIG. 6 is an enlarged cross-sectional view through the connector showing a solderball attached to the contact.

FIG. 6 shows how a solderball 60 is supported by the walls of the pocket in the housing and is stabilized on the mounting surface 54. The walls of the pocket can be shaped as desired to control the position of the solderball and to control the reflow characteristics of the solderball.

The contact 20 has a number of features which reduce solder wicking during solder reflow. With further reference to FIG. 6, the base portion 42 of the contact has a well 56 at an end of the recessed edge 52, and the well is connected to the lower edge 50 by a riser 58. The well 56 and the riser 58 provide a solder dam which serves to control and limit solder migration. Also, the contact arm 46 is connected to an end of the base portion 42 and is separated from a remainder of the base portion 42 by a tunnel 43. This tunnel prevents solder from wicking to the contact arm 46 and also increases the effective length of the contact arm, thereby increasing its resiliency. Further, the contact is normally plated with a tin-lead material while it is attached to a carrier strip, and the contact is sheared from the carrier strip along the lower edge 50 immediately prior to insertion of the contact in the housing. The lower edge 50 remains an unplated surface which is less conducive to solder wicking than a plated surface.

The invention provides a means for stabilizing and controlling the position of a solderball which is joined to a contact in an electrical connector. The invention facilitates placement of the solderball on a sheared edge of a relatively narrow edge-stamped contact. The invention results in a lower profile for the connector because a portion of the solderball is recessed in the connector.

The invention having been disclosed, a number of variations will now become apparent to those skilled in the art. Whereas the invention is intended to encompass the foregoing preferred embodiments as well as a reasonable range of equivalents, reference should be made to the appended claims rather than the foregoing discussion of examples, in order to assess the scope of the invention in which exclusive rights are claimed.

We claim:

1. An electrical connector comprising:
   a dielectric housing having a mating face and a pocket in the mating face; and
   an electrical contact carried by the housing, the electrical contact including a base portion having a recessed edge that is disposed within the housing below the mating face and extends beyond said pocket, a mounting surface for attachment of a solderball which is disposed within the pocket and is formed along the recessed edge, and a riser that extends from the recessed edge of the base portion toward the mating face, thereby providing a solder dam,
   wherein the walls of the pocket closely encompass at least a portion of a solderball attached to the mounting surface.

2. The electrical connector of claim 1 wherein the contact is stamped from sheet material having opposite major surfaces, and the mounting surface is formed along an edge of the contact which extends through a thickness of the sheet material between the opposite major surfaces.

3. The electrical connector of claim 2 wherein the mounting surface has a concave arcuate profile.

4. An electrical connector comprising:
   a dielectric housing having a mating face, a slot in the housing which opens through the mating face, and a pocket in the housing which extends through a portion of the slot at the mating face;
   an electrical contact mounted in the slot, the electricaL contact including a base portion having a recessed edge that is disposed within the housing below the mating face and extends beyond said pocket, a mounting surface which is disposed within the pocket and is formed along the recessed edge, and a riser that extends from the recessed edge of the base portion toward the mating face, thereby providing a solder dam; and
   a solderball attached to the mounting surface in the pocket and extending out of the pocket beyond the mating face;
   wherein the walls of the pocket closely encompass at least a portion of the solderball attached to the mounting surface.

5. The electrical connector of claim 4 wherein the contact is stamped from sheet material having opposite major surfaces, and the mounting surface is formed along an edge of the contact which extends through a thickness of the sheet material between the opposite major surfaces.

6. The electrical connector of claim 5 wherein the mounting surface has a concave arcuate profile.

7. An electrical connector comprising:
   a dielectric housing having a mating face;
   a contact carried by the housing, the contact including a base portion having a recessed edge that is disposed within the housing below the mating face, a mounting surface which is disposed within the housing below the mating face and is formed along the recessed edge, and a riser that extends from the recessed edge of the base portion toward the mating face, thereby providing a solder dam;
   a pocket in the housing which opens through the mating face and extends to the mounting surface of the contact with the recessed edge extending beyond said pocket; and
   a solderball attached to the mounting surface in the pocket and extending out of the pocket beyond the mating face;
   wherein the walls of the pocket closely encompass at least a portion of the solderball attached to the mounting surface.

8. The electrical connector of claim 7 wherein the contact is stamped from sheet material having opposite major surfaces, and the mounting surface is formed along an edge of the contact which extends through a thickness of the sheet material between the opposite major surfaces.

9. The electrical connector of claim 8 wherein the mounting surface has a concave arcuate profile.

10. An electrical connector comprising:
    a dielectric housing having a mating face and a pocket in the mating face; and
    an electrical contact carried by the housing, the electrical contact comprising a base portion disposed within the housing below the mating face, said base portion having a recessed edge comprising a concave arcuate mounting surface disposed within the pocket.

11. The electrical connector of claim 10, wherein the walls of the pocket are configured to closely encompass at least a portion of a solderball attached to the concave arcuate mounting surface.

12. The electrical connector of claim 10 wherein the contact is stamped from sheet material having opposite major surfaces, and the mounting surface is formed along an edge of the contact which extends through a thickness of the sheet material between the opposite major surfaces.

13. The electrical connector of claim 10 wherein the recessed edge extends beyond the concave arcuate mounting surface and a riser extends from the recessed edge toward the mating face, thereby providing a solder dam.

14. An electrical connector comprising:
- a dielectric housing having a mating face, a slot in the housing which opens through the mating face, and a pocket in the housing which extends through a portion of the slot at the mating face;
- an electrical contact mounted in the slot, the electrical contact comprising a base portion disposed within the housing below the mating face, said base portion having a recessed edge comprising a concave arcuate mounting surface disposed within the pocket; and
- a solderball attached to the mounting surface in the pocket and extending out of the pocket beyond the mating face.

15. The electrical connector of claim 14, wherein the walls of the pocket are configured to closely encompass at least a portion of said solderball.

16. The electrical connector of claim 14 wherein the contact is stamped from sheet material having opposite major surfaces, and the mounting surface is formed along an edge of the contact which extends through a thickness of the sheet material between the opposite major surfaces.

17. The electrical connector of claim 14 wherein the recessed edge extends beyond the concave arcuate mounting surface and a riser extends from the recessed edge toward the mating face, thereby providing a solder dam.

18. An electrical connector comprising:
- a dielectric housing having a mating face;
- a contact carried by the housing, the contact comprising a base portion disposed within the housing below the mating surface, said base portion having a recessed edge comprising a concave arcuate mounting edge;
- a pocket in the housing which opens through the mating face and extends to the concave arcuate mounting surface of the contact; and
- a solderball attached to the mounting surface in the pocket and extending out of the pocket beyond the mating face.

\* \* \* \* \*